(12) United States Patent
Kawata et al.

(10) Patent No.: US 10,342,133 B2
(45) Date of Patent: Jul. 2, 2019

(54) DISPLAY DEVICE HAVING A FIRST AREA, A SECOND AREA ADJACENT TO THE FIRST AREA, AND A THIRD AREA ADJACENT TO THE SECOND AREA

(71) Applicant: Japan Display Inc., Minato-ku (JP)

(72) Inventors: Yasushi Kawata, Tokyo (JP); Takumi Sano, Tokyo (JP)

(73) Assignee: Japan Display Inc., Minato-ku (JP)

(*) Notice: Subject to any disclaimer, the term of this patent is extended or adjusted under 35 U.S.C. 154(b) by 0 days.

(21) Appl. No.: 15/635,680

(22) Filed: Jun. 28, 2017

(65) Prior Publication Data

US 2018/0007789 A1    Jan. 4, 2018

(30) Foreign Application Priority Data

Jul. 4, 2016    (JP) .................................. 2016-132683

(51) Int. Cl.
| | | |
|---|---|---|
| *H05K 1/14* | (2006.01) | |
| *H01L 27/32* | (2006.01) | |
| *H05K 1/03* | (2006.01) | |
| *H05K 3/28* | (2006.01) | |
| *H05K 3/36* | (2006.01) | |
| *H01L 51/00* | (2006.01) | |
| *H01L 51/52* | (2006.01) | |

(52) U.S. Cl.
CPC ......... *H05K 1/148* (2013.01); *H01L 27/3244* (2013.01); *H01L 27/3276* (2013.01); *H01L 51/0097* (2013.01); *H01L 51/5253* (2013.01); *H05K 1/0326* (2013.01); *H05K 3/28* (2013.01); *H05K 3/361* (2013.01); *H05K 2201/0108* (2013.01); *H05K 2201/0145* (2013.01); *H05K 2201/042* (2013.01); *H05K 2201/055* (2013.01); *H05K 2201/10128* (2013.01); *Y02E 10/549* (2013.01)

(58) Field of Classification Search
CPC .. H05K 1/148; H05K 1/0326; H01L 27/3244; H01L 27/3276; H01L 51/0097; H01L 51/5253
USPC ....................................................... 361/749
See application file for complete search history.

(56) References Cited

U.S. PATENT DOCUMENTS

| | | | | |
|---|---|---|---|---|
| 9,287,329 | B1* | 3/2016 | Lee .................... | H01L 51/0097 |
| 9,516,743 | B2* | 12/2016 | Kim ....................... | H05K 1/028 |
| 2005/0185127 | A1* | 8/2005 | Fujiyama ............ | G02F 1/13452 |
| | | | | 349/149 |

(Continued)

FOREIGN PATENT DOCUMENTS

| | | |
|---|---|---|
| JP | 2014-232300 | 12/2014 |
| JP | 2015-50181 | 3/2015 |
| JP | 2015-148728 | 8/2015 |

*Primary Examiner* — Tremesha S Willis
(74) *Attorney, Agent, or Firm* — Oblon, McClelland, Maier & Neustadt, L.L.P.

(57) ABSTRACT

According to one embodiment, a display device includes an insulating substrate that includes a first area, a second area adjacent to the first area, and a third area adjacent to the second area, a wiring substrate mounted at a position overlapping the third area on a surface side of the insulating substrate, and a supporting substrate attached to the insulating substrate on the other surface side of the insulating substrate, which is opposite to the surface side, wherein the second area is located between the first area and the third area, and the supporting substrate is provided so as not to overlap the second area.

4 Claims, 11 Drawing Sheets

(56) References Cited

U.S. PATENT DOCUMENTS

| | | |
|---|---|---|
| 2014/0353670 A1 | 12/2014 | Youn et al. |
| 2015/0060778 A1 | 3/2015 | Kim et al. |
| 2015/0221683 A1 | 8/2015 | Odaka et al. |
| 2015/0287750 A1 | 10/2015 | Youn et al. |
| 2016/0181282 A1 | 6/2016 | Odaka et al. |

* cited by examiner

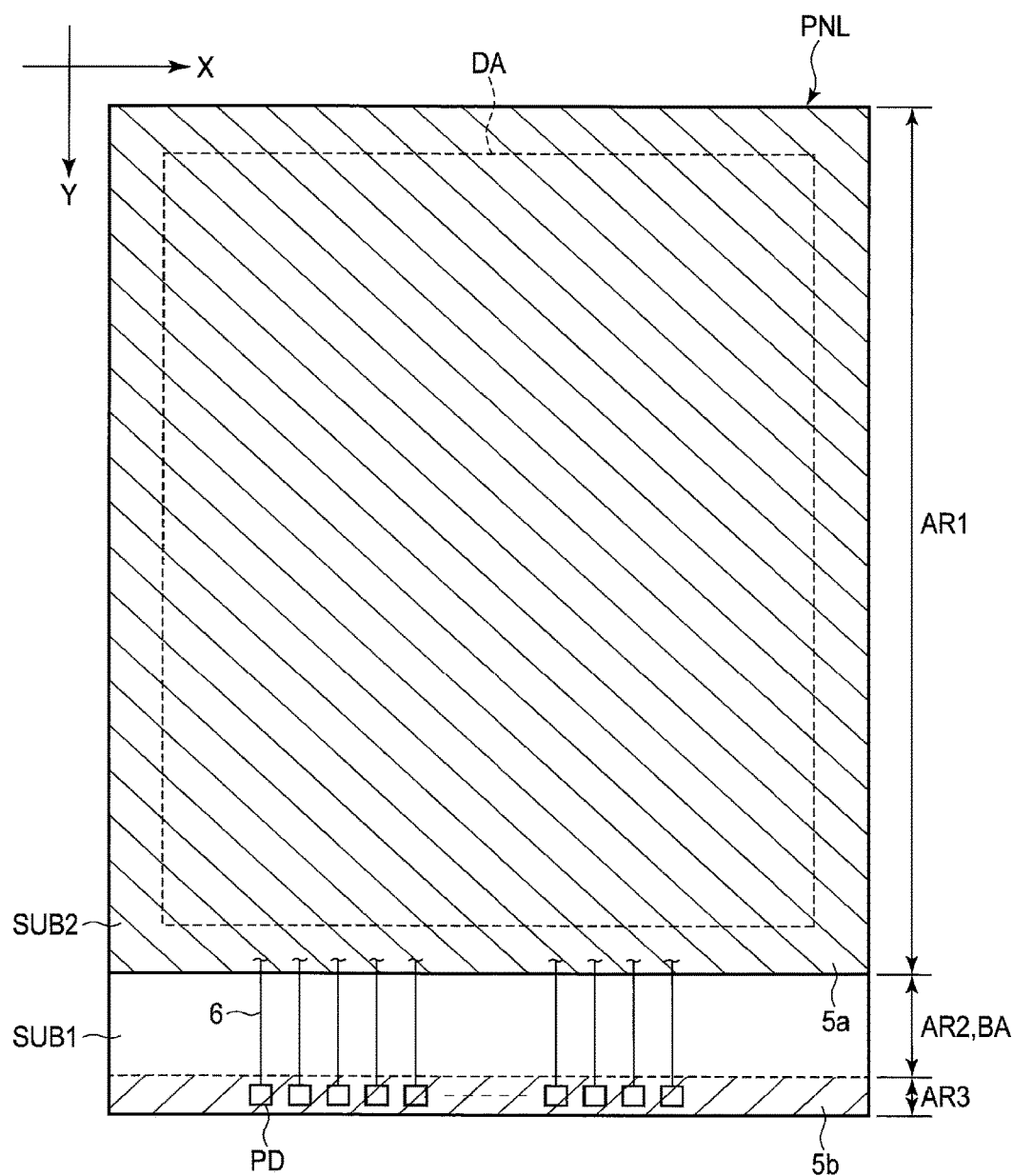
F I G. 4

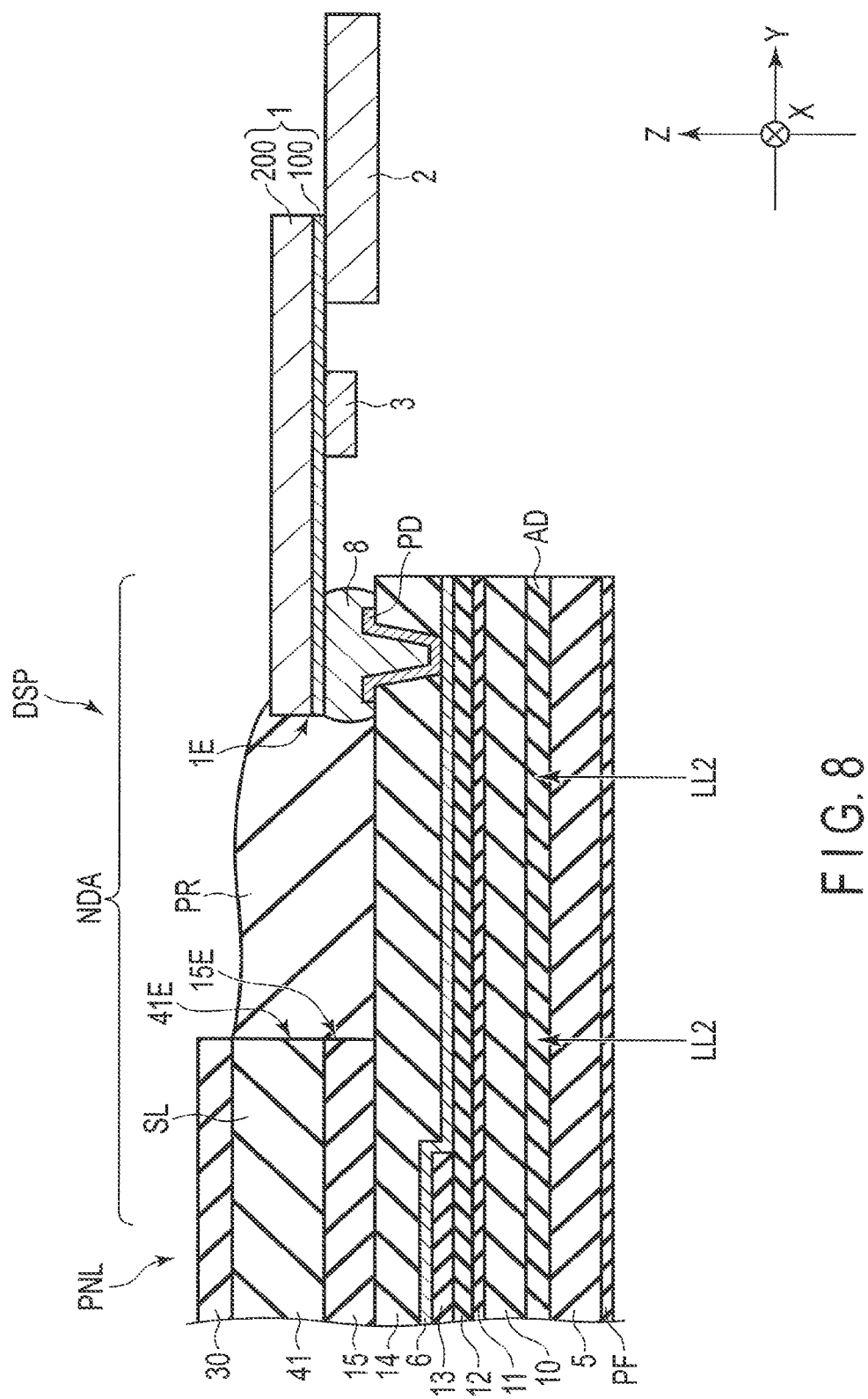
F I G. 8

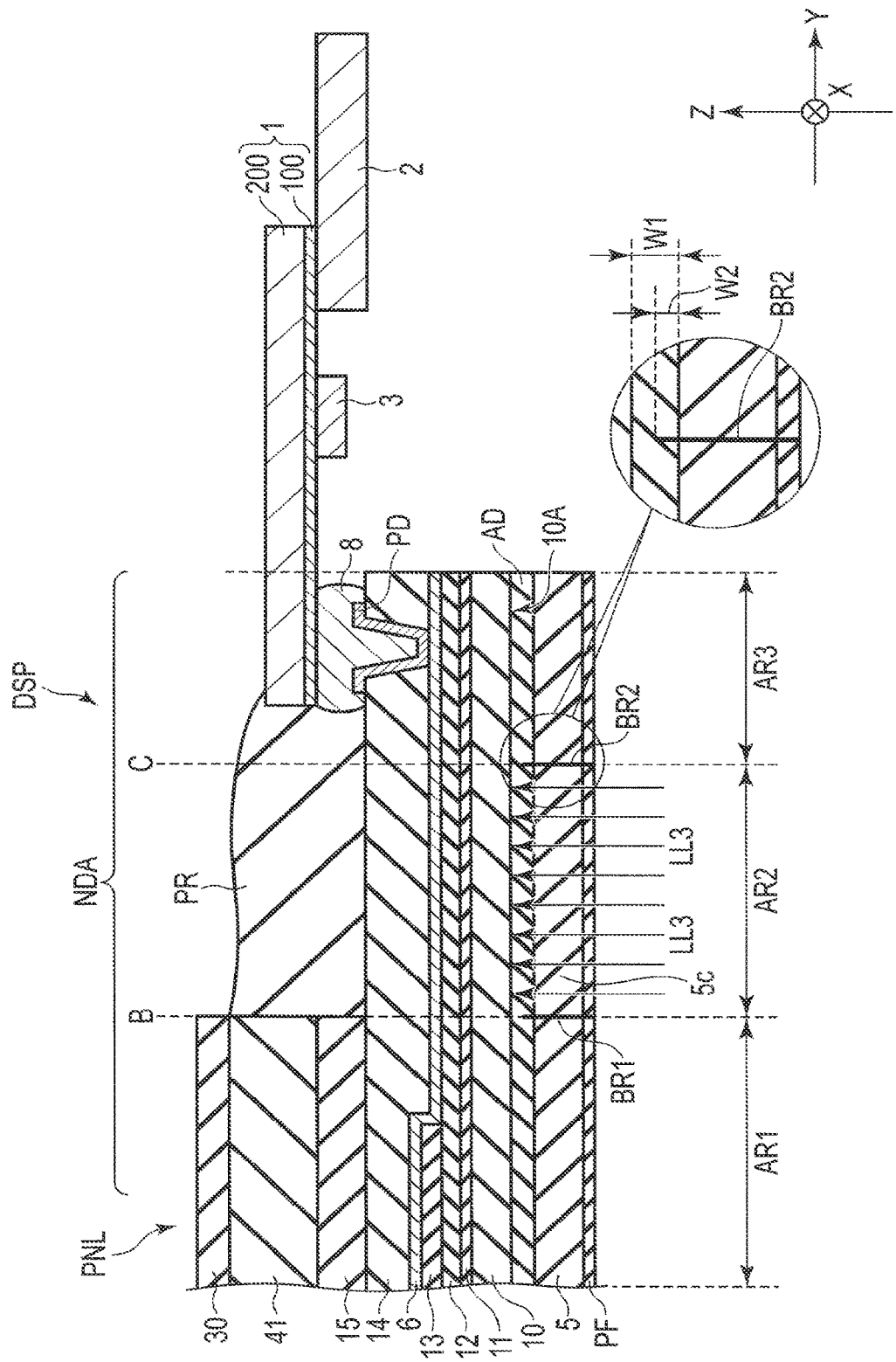
F I G. 9

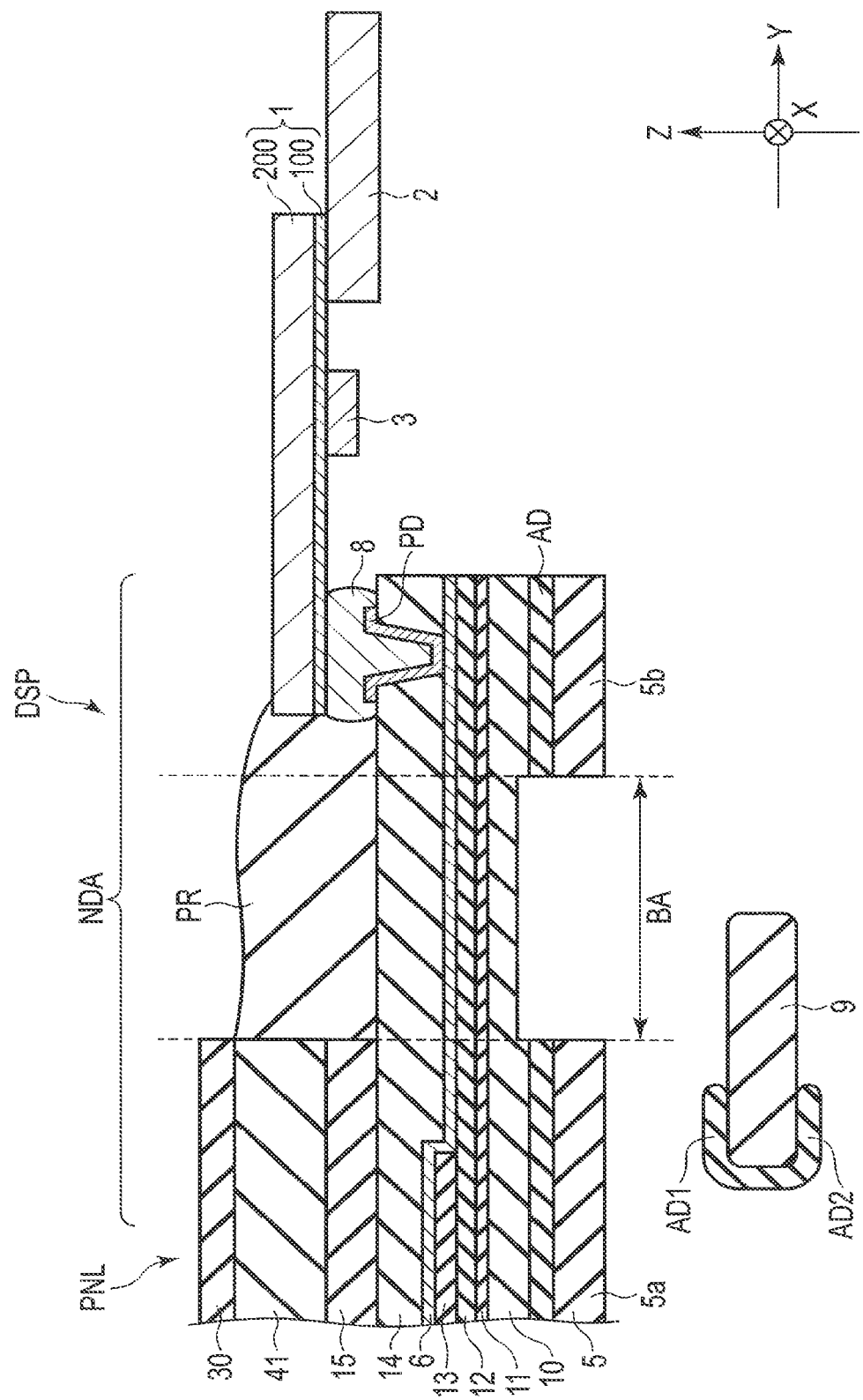
F I G. 11

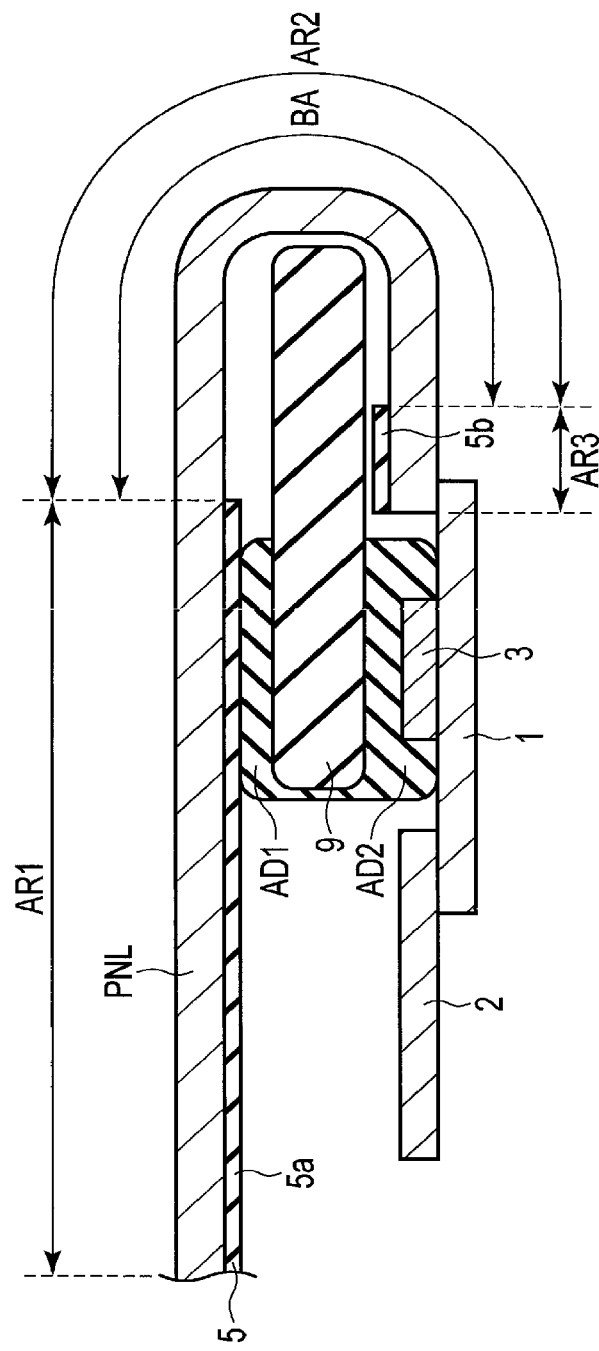
F I G. 12

DISPLAY DEVICE HAVING A FIRST AREA, A SECOND AREA ADJACENT TO THE FIRST AREA, AND A THIRD AREA ADJACENT TO THE SECOND AREA

CROSS-REFERENCE TO RELATED APPLICATIONS

This application is based upon and claims the benefit of priority from Japanese Patent Application No. 2016-132683, filed Jul. 4, 2016, the entire contents of which are incorporated herein by reference.

FIELD

Embodiments described herein relate generally to a display device.

BACKGROUND

Recently, in the field of display devices such as liquid crystal display devices and organic electroluminescence display devices, they have been required to further reduce the size of frames. Recent years have also seen the development of flexible display devices formed of a flexible substrate.

Each of the display devices comprises, for example, a pad connected to an external circuit, etc., in a non-display area around a display area. Voltage is applied to the pad such that the voltage is applied to each pixel. The display device further comprises lines connected to the pad. To reduce the size of the frame, the display device is housed in an electronic device, etc., in a state where the substrate is bent such that the pad is provided on the rear side of the substrate.

As a known technique, an organic electric field light emitting device is manufactured on a glass substrate. Subsequently, the glass substrate is removed. This portion undergoes lamination with a flexible back plate.

BRIEF DESCRIPTION OF THE DRAWINGS

FIG. 4 is a plan view showing a display panel according to the present embodiment, and shows the positional relationships of a first area, a second area and a third area, etc.

FIG. 8 is a cross-sectional view shown for explaining a step for forming a protective layer and a step for cutting the supporting substrate.

FIG. 9 is a cross-sectional view shown for explaining a step for removing a portion of the supporting substrate in the second area.

FIG. 11 is a cross-sectional view shown for explaining a step for bending a bend portion of the display panel.

FIG. 12 is a cross-sectional view showing a state after the bend portion of the display panel shown in FIG. 11 is bent.

DETAILED DESCRIPTION

Figure 1:
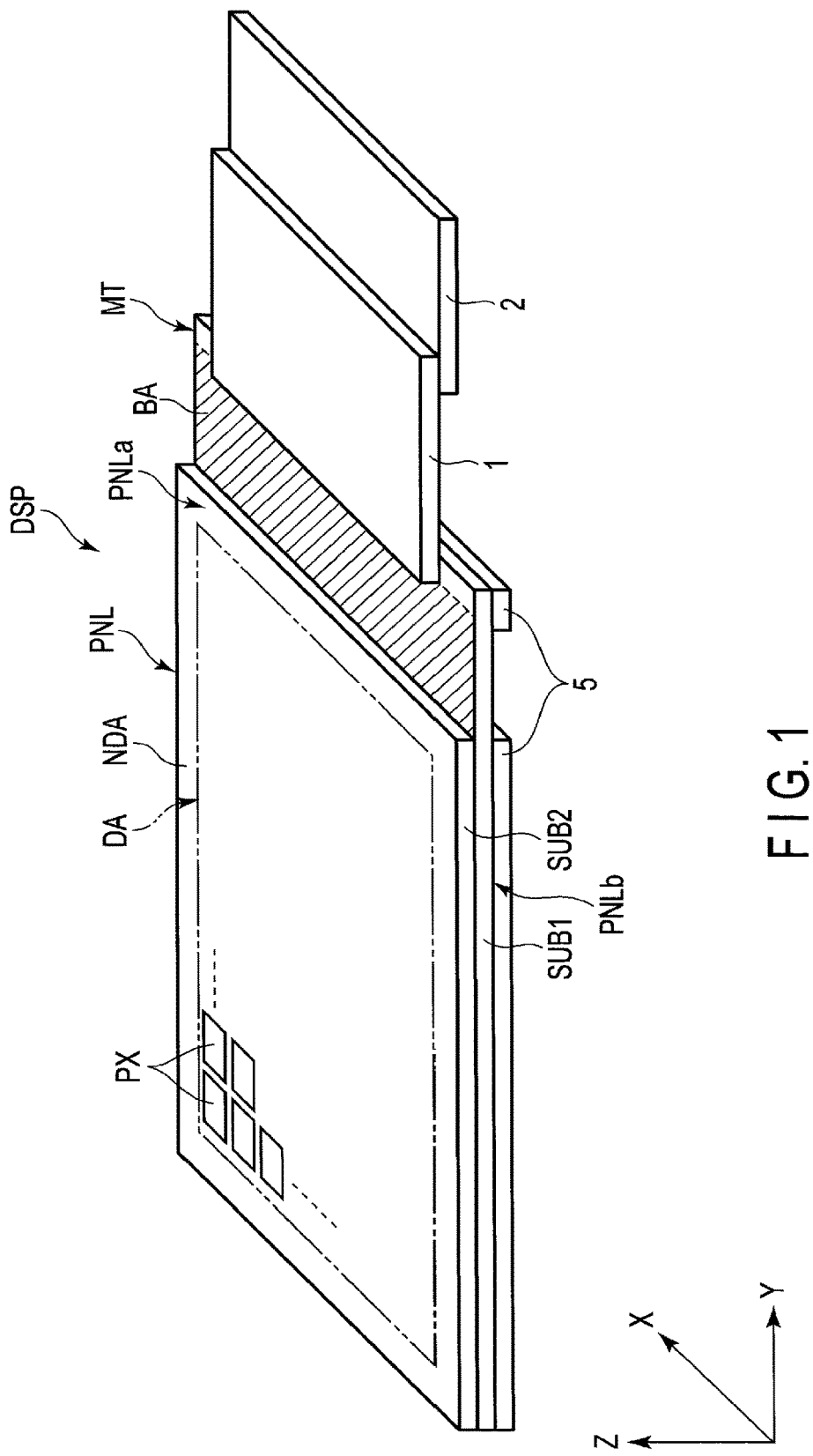
FIG. 1 is a perspective view schematically showing the structure of a display device according to an embodiment.

In general, according to one embodiment, a display device comprising: an insulating substrate comprising a first area, a second area adjacent to the first area, and a third area adjacent to the second area; a wiring substrate mounted at a position overlapping the third area on a surface side of the insulating substrate; and a supporting substrate attached to the insulating substrate on the other surface side of the insulating substrate, which is opposite to the surface side, wherein the second area is located between the first area and the third area, and the supporting substrate is provided so as not to overlap the second area.

An embodiment will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

To begin with, this specification explains the details of a display device according to an embodiment. FIG. 1 is a perspective view schematically showing the structure of a display device DSP according to an embodiment. FIG. 1 shows a three-dimensional space defined by a first direction X, a second direction Y perpendicular to the first direction X, and a third direction Z perpendicular to the first direction X and the second direction Y. The first direction X and the second direction Y are orthogonal to each other. However, they may intersect at an angle other than 90'. In the present embodiment, the display device is assumed to be an organic electroluminescence display device.

In the present embodiment, the third direction Z is defined as an upward direction or an upper side. The opposite direction of the third direction Z is defined as a downward direction or a lower side. When this specification uses the phrases "a second member above a first member" and "a second member under a first member", the second member may be in contact with the first member, or may be separated from the first member. In the latter case, a third member may be interposed between the first member and the second member. When this specification uses the phases "a second member on a first member" and "a second member directly under a first member", the second member is in contact with the first member.

As shown in FIG. 1, the display device DSP comprises a display panel PNL, a wiring substrate 1, a flexible wiring substrate 2 and a supporting substrate 5. The display panel PNL comprises a plate-like first substrate SUB1 and a plate-like second substrate SUB2 facing the first substrate SUB1.

The display panel PNL comprises a display area DA which displays an image, and a non-display area NDA which surrounds the display area DA. The display panel PNL comprises a plurality of pixels PX in the display area DA. The pixels PX are arranged in matrix in the first direction X and the second direction Y.

The first substrate SUB1 comprises a mounting portion MT extending to the external side in comparison with the area in which the first substrate SUB1 overlaps the second substrate SUB2. More specifically, three side edges of the first substrate SUB1 are aligned with three side edges of the second substrate SUB2 in the third direction Z. The length of a side edge of the first substrate SUB1 parallel to the first direction X is substantially equal to the length of a corresponding side edge of the second substrate SUB2 parallel to the first direction X. The side edges of the first substrate SUB1 parallel to the second direction Y are longer than the side edges of the second substrate SUB2 parallel to the second direction Y. Thus, the area of the first substrate SUB1 parallel to the X-Y plane is greater than the area of the second substrate SUB2 parallel to the X-Y plane. The X-Y plane is a plane defined by the first direction X and the second direction Y. In the present embodiment, the length of the side edges of the second substrate SUB2 parallel to the second direction Y may be substantially equal to the length of the side edges of the first substrate SUB1 parallel to the second direction Y. In this case, the area of the first substrate SUB1 parallel to the X-Y plane is substantially equal to the area of the second substrate SUB2 parallel to the X-Y plane.

In the example of FIG. 1, the wiring substrate 1 is mounted in the non-display area NDA above the mounting portion MT. The wiring substrate 1 is mounted on the same side as a surface PNLa of the display panel PNL. In the example of FIG. 1, the side edges of the wiring substrate 1 parallel to the first direction X are shorter than the side edges of the first and second substrates SUB1 and SUB2 parallel to the first direction X. However, the length of the side edges of the wiring substrate 1 parallel to the first direction X may be equal to the length of the side edges of the first and second substrates SUB1 and SUB2 parallel to the first direction X. The display panel PNL is electrically connected to the wiring substrate 1. The flexible wiring substrate 2 is provided under the wiring substrate 1.

In the present embodiment, the display device DSP comprises a bend area BA which is bent when the display device DSP is put in the housing of an electronic device, etc. In FIG. 1, the bend area BA is diagonally shaded. The bend area BA is bent such that the wiring substrate 1 and the flexible wiring substrate 2 are provided on the lower side of the display area DA. The bend area BA is located in the non-display area NDA.

The supporting substrate 5 is attached to the lower side of the display panel PNL. The supporting substrate 5 is provided on the same side as the other surface PNLb of the display panel PNL. In other words, the supporting substrate 5 is provided on a side opposite to the surface PNLa side. As described later, the supporting substrate 5 is provided so as not to overlap the bend area BA in the third direction Z. In the present embodiment, an area other than the mounting portion MT and the bend area BA is equivalent to a first area AR1 of an insulating substrate as described later. The bend area BA is equivalent to a second area AR2 of the insulating substrate as described later. The mounting portion MT is equivalent to a third area AR3 of the insulating substrate as described later. The first area AR1 includes the display area DA.

Figure 2:
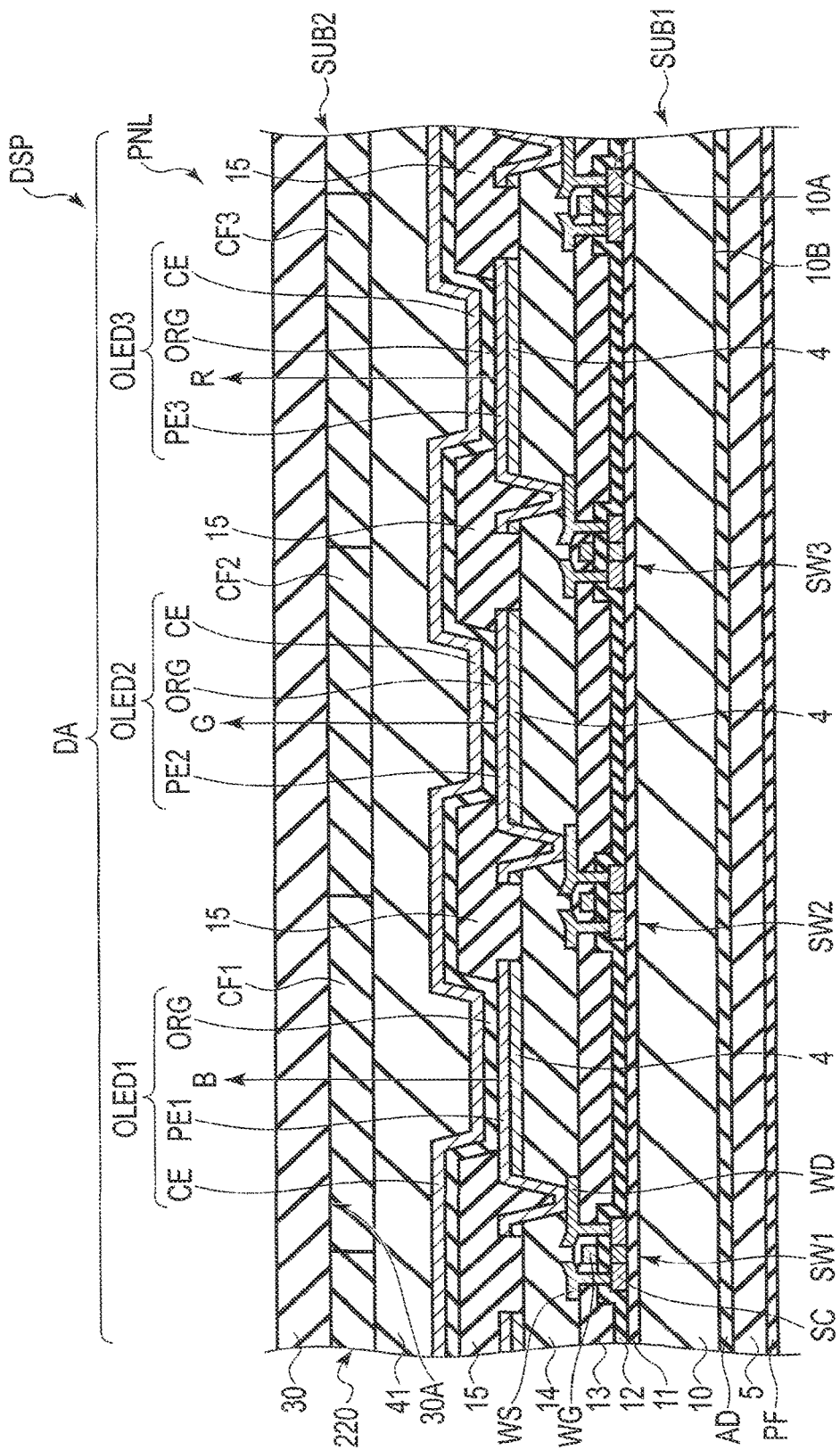
FIG. 2 is a cross-sectional view showing a display area provided in the display device shown in FIG. 1.

FIG. 2 is a cross-sectional view showing the display area DA of the display device DSP shown in FIG. 1.

As shown in FIG. 2, the first substrate SUB1 comprises, for example, a first insulating substrate 10, switching elements SW1, SW2 and SW3, a reflective layer 4, organic electroluminescence elements OLED1, OLED2 and OLED3, a sealing layer 41 and the supporting substrate 5. The first insulating substrate 10 is formed of an organic insulating material such as polyimide. The first insulating substrate 10 is covered with a first insulating film 11.

The switching elements SW1, SW2 and SW3 are formed above the first insulating film 11. In the example of FIG. 2, the switching elements SW1, SW2 and SW3 are formed by top-gate thin-film transistors. However, they may be formed by bottom-gate thin-film transistors. The switching elements SW1, SW2 and SW3 have the same structure. Thus, the detailed structure of the switching element SW1 is explained as a typical example. The switching element SW1 comprises a semiconductor layer SC formed on the first insulating film 11. The semiconductor layer SC is covered with a second insulating film 12. The second insulating film 12 is also provided on the first insulating film 11.

The switching element SW1 comprises a gate electrode WG formed on the second insulating film 12 and located immediately above the semiconductor layer SC. The gate electrode WG is covered with a third insulating film 13. The third insulating film 13 is also provided on the second insulating film 12.

The first insulating film 11, the second insulating film 12 and the third insulating film 13 are formed of an inorganic material such as silicon oxide or silicon nitride.

The switching elements SW1 comprises a source electrode WS and a drain electrode WD on the third insulating film 13. The source electrode WS and the drain electrode WD are electrically connected to the semiconductor layer SC via respective contact holes penetrating the second insulating film 12 and the third insulating film 13. The switching element SW1 is covered with a fourth insulating film 14. The fourth insulating film 14 is also provided on the third insulating film 13. The fourth insulating film 14 is formed of an organic material such as transparent resin.

The reflective layer 4 is formed on the fourth insulating film 14. The reflective layer 4 is formed of a highly light-reflective metal material such as aluminum or silver. Note that the surface of the reflective layer 4 (that is, the surface on the second substrate SUB2 side) may be flat, or may be irregular to impart light scattering properties.

The organic electroluminescence elements OLED1 to OLED3 are formed on the fourth insulating film 14. In the example of FIG. 2, the organic electroluminescence element OLED1 is electrically connected to the switching element SW1. The organic electroluminescence element OLED2 is electrically connected to the switching element SW2. The organic electroluminescence element OLED3 is electrically connected to the switching element SW3. Each of the organic electroluminescence elements OLED1 to OLED3 is configured as a top-emission type which emits white light toward the second substrate SUB2. These organic electroluminescence elements OLED1 to OLED3 have the same structure.

The organic electroluminescence element OLED1 comprises a pixel electrode PE1 formed on the reflective layer 4. The pixel electrode PE1 is in contact with the drain electrode WD of the switching element SW1, and is electrically connected to the switching element SW1. Similarly, the organic electroluminescence element OLED2 comprises a pixel electrode PE2 electrically connected to the switching element SW2. The organic electroluminescence element OLED3 comprises a pixel electrode PE3 electrically connected to the switching element SW3. The pixel electrodes PE1, PE2 and PE3 are formed of a transparent conductive material such as indium tin oxide (ITO) or indium zinc oxide (IZO).

The organic electroluminescence elements OLED1 to OLED3 further comprise an organic light emitting layer ORG and a common electrode CE. One of each pixel electrode PE and the common electrode CE is a positive electrode. The other one is a negative electrode. The organic light emitting layer ORG is located on the pixel electrodes PE1 to PE3. The common electrode CE is located on the organic light emitting layer ORG. The common electrode CE is formed of a transparent conductive material such as ITO or IZO. In the example of FIG. 2, the organic electroluminescence elements OLED1 to OLED3 are defined by ribs 15. Although not shown in FIG. 2, a transparent sealing film is preferably used to seal in the organic electroluminescence elements OLED1 to OLED3.

The sealing layer 41 covers the upper sides of the organic electroluminescence elements OLED1, OLED2 and OLED3. The sealing layer 41 is formed so as to seal in the members provided between the first insulating substrate 10 and the sealing layer 41. The sealing layer 41 prevents intrusion of oxygen or moisture into the organic electroluminescence elements OLED1, OLED2 and OLED3, and degradation of the organic electroluminescence elements OLED1, OLED2 and OLED3. The sealing layer 41 may be formed as a stacked layer including an inorganic film and an organic film.

The second substrate SUB2 comprises a second insulating substrate 30, a color filter layer 220, etc. The second insulating substrate 30 is provided on the sealing layer 41. The second insulating substrate 30 may be a glass substrate or a resin substrate, or may be an optical element including an optical film, a polarizer, etc. The second insulating substrate 30 is attached to, for example, the sealing layer 41.

The color filter layer 220 is provided on the inner surface 30A side of the second insulating substrate 30. The color filter layer 220 comprises color filters CF1, CF2 and CF3. The color filters CF1, CF2, and CF3 are formed of resin materials of different colors. For example, the color filter CF1 is a blue color filter. The color filter CF2 is a green color filter. The color filter CF3 is a red color filter. The color filter layer 220 may further include a white or transparent color filter. The color filters CF1, CF2 and CF3 face the organic electroluminescence elements OLED1, OLED2 and OLED3, respectively.

The first insulating substrate 10 comprises a surface 10A and the other surface 10B. The supporting substrate 5 is provided on the surface 10B side opposite to the surface 10A side. The supporting substrate 5 is attached to the first insulating substrate 10 by an adhesive layer AD. The supporting substrate 5 is preferably formed of, for example, an inexpensive material which exerts a good heat resistance, gas-insulating property, moisture-proof property and strength. For example, the supporting substrate 5 is resistant to heat to the extent that its properties or shape is not changed by the temperature of the process for manufacturing the display device DSP. For example, the supporting substrate 5 has a strength greater than that of the first insulating substrate 10, and functions as a supporting layer which prevents the display panel PNL from bending in a state where no external stress is applied. For example, the supporting substrate 5 has a moisture-proof property to prevent incursion of moisture, etc., into the first insulating substrate 10 and a gas-insulating property to prevent incursion of gas, and functions as a barrier layer. In the present embodiment, the supporting substrate 5 is a film formed of, for example, polyethylene terephthalate. In the present embodiment, for example, the width of the supporting substrate 5 in the third direction Z is approximately 50 μm.

A protective film PF covers the lower side of the supporting substrate 5. For example, the lower surface or upper surface of the protective film PF is rough, and scatters transmitted light. The protective film PF is a film formed of, for example, polyethylene. For example, the haze value of the protective film PF is greater than that of the supporting substrate 5.

In the above display device DSP, when the organic electroluminescence elements OLED1 to OLED3 emit light, the light (white light) is emitted to the outside through the color filters CF1, CF2 and CF3. At this time, the color filter CF1 transmits light having a blue wavelength in the white light emitted from the organic electroluminescence element OLED1. The color filter CF2 transmits light having a green wavelength in the white light emitted from the organic electroluminescence element OLED2. The color filter CF3 transmits light having a red wavelength in the white light emitted from the organic electroluminescence element OLED3. In this way, color display is realized.

Each pixel PX shown in FIG. 1 is, for example, the smallest unit of a color image, and comprises the above organic electroluminescence elements OLED1 to OLED3.

In the above structural example, the organic electroluminescence elements OLED1 to OLED3 comprise the common organic light emitting layer ORG. However, the structure is not limited to this example. For example, the organic electroluminescence element OLED1 may comprise an organic light emitting layer which emits blue light. The organic electroluminescence element OLED2 may comprise an organic light emitting layer which emits green light. The organic electroluminescence element OLED3 may comprise an organic light emitting layer which emits red light. In this structural example, the color filter layer 220 may be omitted.

Figure 3:
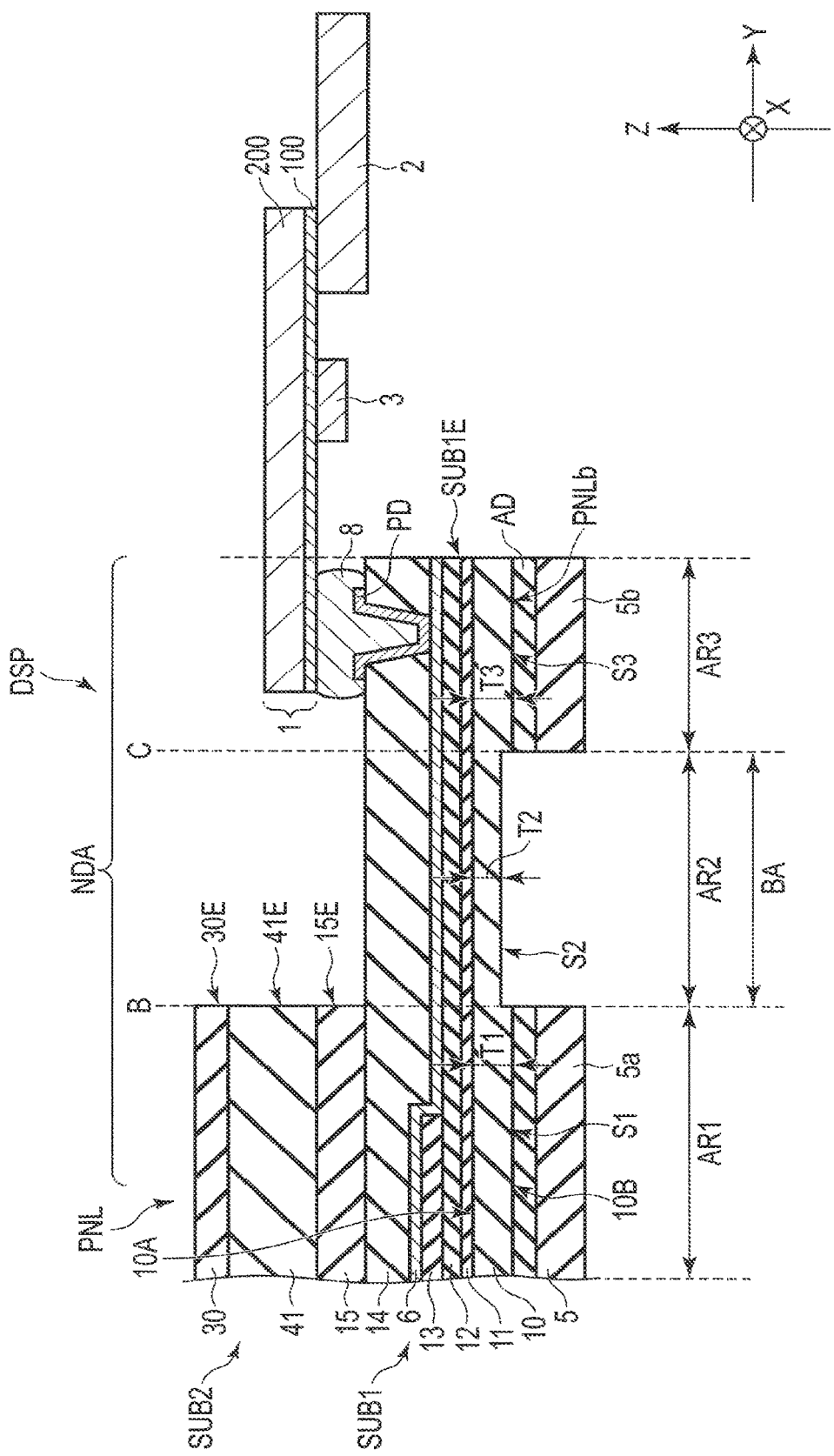
FIG. 3 is a cross-sectional view including a non-display area provided in the display device shown in FIG. 1.

FIG. 3 is a cross-sectional view including the non-display area NDA of the display device DSP shown in FIG. 1. In the present embodiment, a plan view is defined as appearance when the first substrate SUB1 is seen from the second substrate SUB2.

The supporting substrate 5 comprises a first portion 5a, and a second portion 5b separated from the first portion 5a. The first insulating substrate 10 comprises the first area AR1, the second area AR2 adjacent to the first area AR, and the third area AR3 adjacent to the second area AR2. The second area AR2 is located between the first area AR1 and the third area AR3. The first area AR1 is equivalent to the area overlapping the first portion 5a as seen in plan view. The second area AR2 is equivalent to the area in which the supporting substrate 5 is not provided as seen in plan view. The third area AR3 is equivalent to the area overlapping the second portion 5b as seen in plan view. The first portion 5a is attached to the first area AR1 by the adhesive layer AD. The second portion 5b is attached to the third area AR3 by the adhesive layer AD. The boundary surface between the first area AR1 and the second area AR2 is referred to as boundary surface B. The boundary surface between the second area AR2 and the third area AR3 is referred to as boundary surface C.

The first insulating substrate 10 has film thickness T1 in the first area AR1, film thickness T2 in the second area AR2, and film thickness T3 in the third area AR3. Film thickness T1 is substantially equal to film thickness T3. Film thickness T2 is less than film thickness T1 and film thickness T3. On the surface 10B side of the first insulating substrate 10, the first insulating substrate 10 comprises a first surface S1 located in the first area AR1, a second surface S2 located in the second area AR2, and a third surface S3 located in the third area AR3. The second surface S2 is located on the upper side in comparison with the first surface S1 and the third surface S3 in the third direction Z. The first surface S1 and the third surface S3 are located in substantially the same plane. As described later, the second surface S2 is rougher than the first surface S1 and the third surface S3.

In the example of FIG. 3, the first insulating film 11 and the second insulating film 12 extend to an end portion SUB1E of the first substrate SUB1. The third insulating film 13 ends in the first area AR1, and does not reach boundary surface B.

A signal line 6 is provided on the third insulating film 13 in the first area AR1. The signal line 6 is also provided on the second insulating film 12. The signal line 6 is formed on the surface 10A side of the first insulating substrate 10. The signal line 6 is continuously provided from the first area AR1 to the third area AR3, and extends to the end portion SUB1E of the first substrate SUB1. The signal line 6 is formed by, for example, a stacked layer containing titanium, aluminum and titanium. The signal line 6 is equivalent to a power line, various control lines, etc. The fourth insulating film 14 covers the signal line 6. The fourth insulating film 14 comprises a contact hole CH penetrating to the signal line 6 in the third area AR3. The fourth insulating film 14 may not be formed. The signal line 6 may be exposed from the upper side of the display panel PNL.

A pad PD is provided in the third area AR3. The pad PD is provided on the fourth insulating film 14, and is also provided in the contact hole CH. The pad PD is electrically connected to the signal line 6 in the contact hole CH. For example, the pad PD is formed in the same process using the same material as those of the pixel electrodes PE1, PE2 and PE3 shown in FIG. 2. The pad PD is formed of ITO, IZO, etc.

The signal line 6 and the pad PD may be provided in the same layer. In this case, the signal line 6 and the pad PD may be separately formed, or may be integrally formed. As shown in FIG. 3, the signal line 6 and the pad PD may be provided in different layers such that they are electrically connected to each other via the contact hole formed in the interlayer insulating film between the signal line 6 and the pad PD.

In the example of FIG. 3, the rib 15, the sealing layer 41 and the second insulating substrate 30 are provided in the first area AR1. In the example, an end portion 15E of the rib 15, an end portion 41E of the sealing layer 41, and an end portion 30S of the second insulating substrate 30 are located on boundary surface B. The end portion 15E of the rib 15, the end portion 41E of the sealing layer 41 and the end portion 30E of the second insulating substrate 30 may not be located on boundary surface B. They may be located on the first area AR1 side in comparison with boundary surface B. Alternatively, they may be located on the second area AR2 side in comparison with boundary surface B.

The wiring substrate 1 is mounted at a position overlapping the third area AR3 on the surface 10A side of the first insulating substrate 10. The wiring substrate 1 comprises a core substrate 200, a connective line 100 provided on the lower surface side of the core substrate 200, and a driver IC chip 3 provided on the lower surface side of the core substrate 200. The driver IC chip 3 functions as a signal supply source which supplies a signal necessary for driving the display panel PNL, etc. The position of the driver IC chip 3 is not particularly limited. The driver IC chip 3 may be provided on the upper surface side of the core substrate 200. The flexible wiring substrate 2 is provided on the lower surface side of the wiring substrate 1.

The display panel PNL and the wiring substrate 1 are electrically connected and attached to each other by an anisotropic conductive film 8 which is a conductive material. The anisotropic conductive film 8 contains conductive particles dispersed in an adhesive agent. The wiring substrate 1 and the display panel PNL are electrically and physically connected to each other by applying pressure and heat to the wiring substrate 1 and the display panel PNL from the upper and lower sides along the third direction Z while the anisotropic conductive film 8 is interposed therebetween. The anisotropic conductive film 8 is in contact with and electrically connected to the pad PD. The anisotropic conductive film 8 is in contact with and electrically connected to the connective line 100. In this manner, the connective line 100 is electrically connected to the pad PD and the signal line 6 by the anisotropic conductive film 8.

The bend area BA shown in FIG. 1 is included in the second area AR2. When the bend area BA is bent, the first insulating substrate 10 is also bent. Alternatively, the bend area BA is an area equivalent to the second area AR2. When the bend area BA is bent, the pad PD is provided on the rear side of the display panel PNL.

FIG. 4 is a plan view showing the display panel PNL according to the present embodiment. FIG. 4 shows the positional relationships of the first area AR1, the second area AR2 and the third area AR3, etc. In FIG. 4, the first area AR1 is shown by diagonal lines from bottom right to top left. The third area AR3 is shown by diagonal lines from bottom left to top right. As shown in FIG. 4, the second area AR2 extends from an end portion to the other end portion of the display panel PNL in the first direction X, and is located between the first area AR1 and the third area AR3.

As shown in FIG. 3, the first area AR1 is equivalent to the area overlapping the first portion 5a of the supporting substrate 5 in a plan view. The second area AR2 is equivalent to the area in which the supporting substrate 5 is not provided in a plan view. The third area AR3 is equivalent to the area overlapping the second portion 5b of the supporting substrate 5 in a plan view. As seen in plan view, a plurality of pads PD overlap the third area AR3, and are arranged in the first direction X. The bend area BA is located in the second area AR2. A plurality of signal lines 6 are connected to the respective pads PD. The signal lines 6 extend in the second direction Y and are arranged in the first direction X in the bend area BA.

Now, this specification explains a process for manufacturing the display device of the present embodiment with reference to FIG. 5 to FIG. 12.

Figure 5:
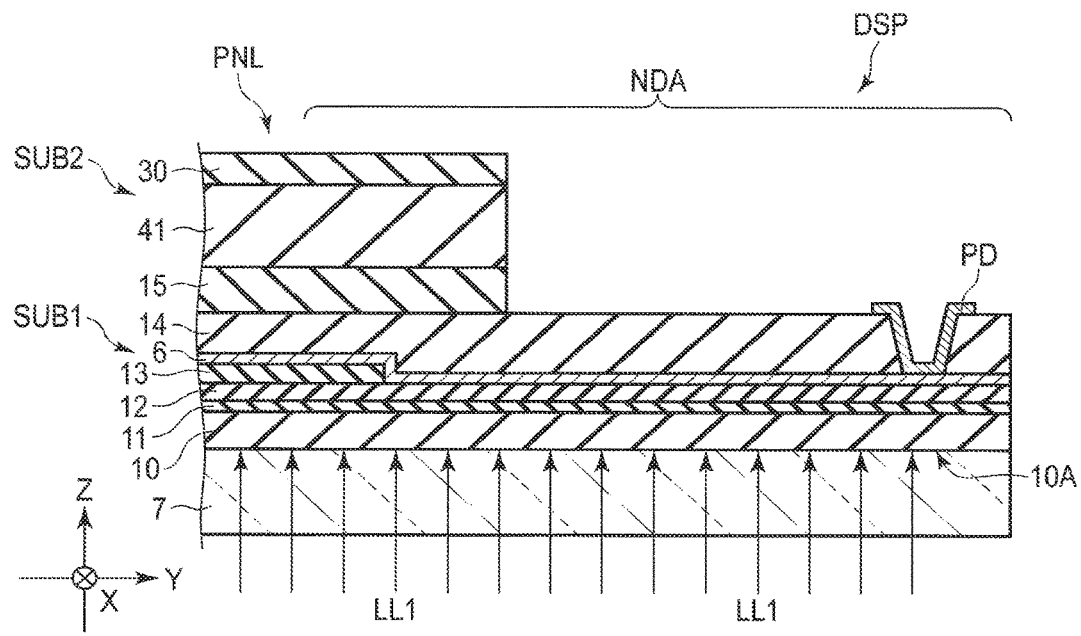
FIG. 5 is a cross-sectional view shown for explaining a step for removing a substrate from a first insulating substrate.

FIG. 5 is a cross-sectional view shown for explaining a step for removing a substrate 7 from the first insulating substrate 10. The structural elements of the first substrate SUB1, such as the first insulating substrate 10, the signal line 6 and the pad PD, are formed in series on the substrate 7. Subsequently, the second substrate SUB2 is attached to the first substrate SUB1.

Subsequently, laser light LL1 is emitted to the lower side of the substrate 7 to remove the substrate 7 from the first insulating substrate 10. In the present embodiment, for example, the substrate 7 is formed of glass. The first insulating substrate 10 is formed of polyimide. When laser light LL1 is emitted to the rear side of the substrate 7, laser light LL1 reaches the surface 10A of the first insulating substrate 10. The first insulating substrate 10 undergoes ablation. Specifically, the first insulating substrate 10 absorbs and resolves laser light LL1 at the interface between the substrate 7 and the first insulating substrate 10. Thus, a space is created at the interface between the substrate 7 and the first insulating substrate 10. The substrate 7 is removed from the first insulating substrate 10. At this time, for example, the wavelength of laser light LL1 is approximately 308 nm.

Figure 6:
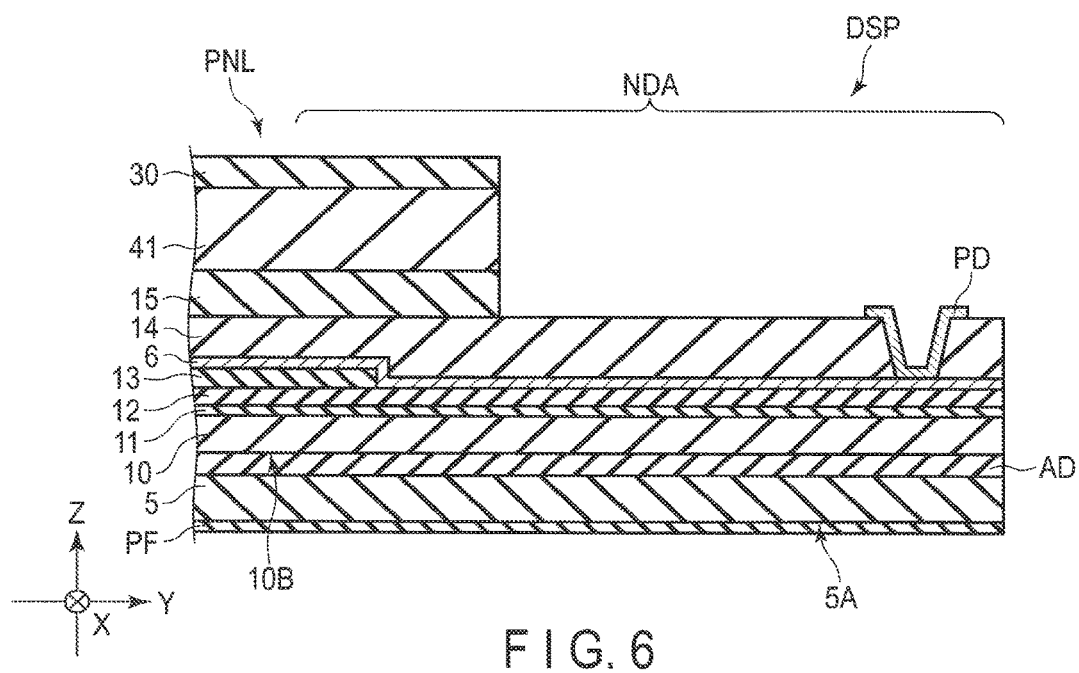
FIG. 6 is a cross-sectional view shown for explaining a step for attaching a supporting substrate by an adhesive layer.

FIG. 6 is a cross-sectional view shown for explaining a step for attaching the supporting substrate 5 by the adhesive layer AD.

The protective film PF is attached to a surface 5A of the supporting substrate 5 before the supporting substrate 5 is attached to the first substrate 10. The supporting substrate 5 integrated with the protective film PF is attached to the first insulating substrate 10 by the adhesive layer AD. Specifically, an alignment treatment is applied to the supporting substrate 5 in a state where, for example, an adhesive sheet is provided as the adhesive layer AD between the first insulating substrate 10 and the supporting substrate 5. Subsequently, heat is applied to attach the supporting substrate 5 to the surface 10B side of the first insulating substrate 10. In this way, the supporting substrate 5 is heated after the alignment treatment. Thus, the supporting substrate 5 can be attached to a correct position.

Figure 7:
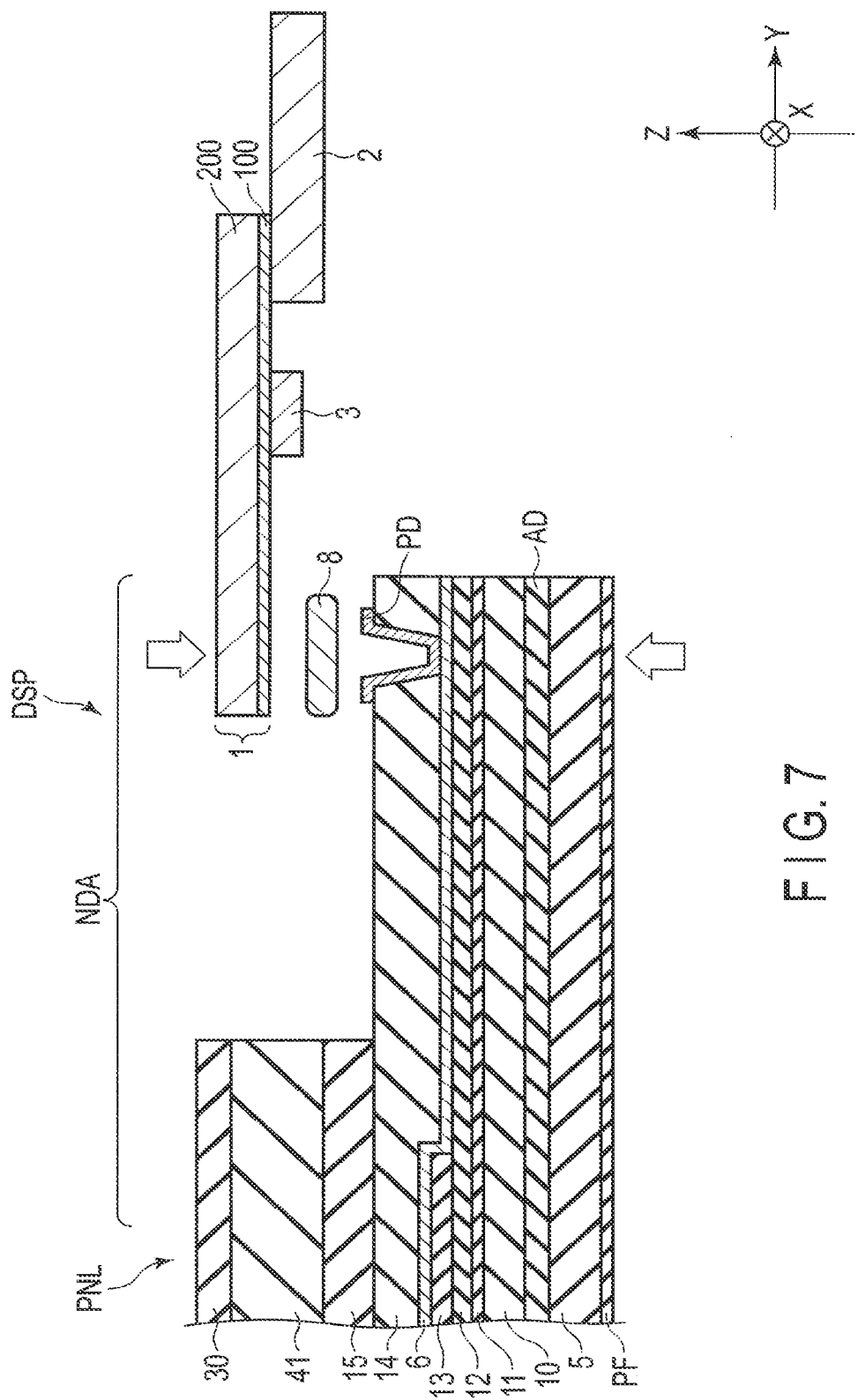
FIG. 7 is a cross-sectional view shown for explaining a step for pressing a wiring substrate onto the display panel such that they are attached to each other.

FIG. 7 is a cross-sectional view shown for explaining a step for pressing the wiring substrate 1 onto the display panel PNL such that they are attached to each other.

Subsequently, the wiring substrate 1 is pressed onto the display panel PNL such that they are attached to each other by the anisotropic conductive film 8. Specifically, the anisotropic conductive film 8 is provided at a position overlapping the pad PD between the wiring substrate 1 and the display panel PNL. Pressure is applied from the upper side of the wiring substrate 1 and the lower side of the display panel PNL in the directions of the arrows shown in FIG. 7. Subsequently, heat is applied. In this manner, the anisotropic conductive film 8 fuses, and the conductive particles contained in the anisotropic conductive film 8 are brought into contact with the pad PD. Thus, the wiring substrate 1 and the display panel PNL are electrically and physically connected to each other.

The wiring substrate 1 is pressed onto and attached to the display panel PNL by the above steps.

From the step subsequent to the removal of the substrate 7 from the first insulating substrate 10 to the step shown in FIG. 7, the supporting substrate 5 is provided over substantially the entire part of the lower surface of the display panel PNL. Thus, it is possible to prevent the breaks of lines including the signal line 6.

FIG. 8 is a cross-sectional view shown for explaining a step for forming a protective layer PR and a step for cutting the supporting substrate 5.

Subsequently, the protective layer PR is formed on the fourth insulating film 14. In the example of FIG. 8, the protective layer PR covers the end portion 15E of the rib 15 and the end portion 41E of the sealing layer 41. The protective layer PR also covers an end portion 1E of the wiring substrate 1. For example, the protective layer PR is formed of an organic insulating material, and is formed by curing with ultraviolet irradiation.

Subsequently, laser light LL2 is emitted to the lower side of the supporting substrate 5 to cut the supporting substrate 5. To remove the supporting substrate 5 in the bend portion, two portions of the supporting substrate 5 are cut. At this time, laser light LL2 is CO2 laser light. The wavelength of laser light LL2 is, for example, approximately 9.6 µm.

FIG. 9 is a cross-sectional view shown for explaining a step for removing a portion 5c of the supporting substrate 5 in the second area AR2.

After laser light LL2 is emitted to the lower side of the supporting substrate 5, slits BR1 and BR2 are formed in the protective film PF, the supporting substrate 5 and the adhesive layer AD. In the step shown in FIG. 8, the position of the supporting substrate 5 overlapping the interface between the first area AR1 and the second area AR2 and the position of the supporting substrate 5 overlapping the interface between the second area AR2 and the third area AR3 are cut by laser light LL2. Thus, the position of boundary surface B is determined by the position of the slit BR1. The position of boundary surface C is determined by the position of the slit BR2. The slits BR1 and BR2 penetrate the protective film PF and the supporting substrate 5. Neither the slit BR1 nor the slit BR2 penetrates the adhesive layer AD. The slits BR1 and BR2 extend to a halfway position of the adhesive layer AD. The width of the adhesive layer AD is width W1. In the slit BR2, width W2 is the width of the cut portion of the adhesive layer AD. For example, width W2 is substantially half width W1. In the present embodiment, for example, width W1 is approximately 30 µm. Width W2 is approximately 15 µm.

Subsequently, laser light LL3 is emitted to the lower side of the first insulating substrate 10 in the second area AR2 to remove the portion 5c in which the supporting substrate 5 overlaps the second area AR2. Laser light LL3 reaches the surface 10A of the first insulating substrate 10. The first insulating substrate 10 undergoes ablation at the interface between the adhesive layer AD and the first insulating substrate 10. In this way, a space is created at the interface between the first insulating substrate 10 and the adhesive layer AD in the second area AR2. As the slits BR1 and BR2 are formed in the supporting substrate 5, the portion 5c in which the supporting substrate 5 overlaps the second area AR2 is removed from the first insulating substrate 10.

In the step shown in FIG. 9, the absorptance of the first insulating substrate 10 for the wavelength of laser light LL3 is preferably greater than that of the supporting substrate 5 for the wavelength of laser light LL3. The wavelength of laser light LL3 is different from that of laser light LL2. The wavelength of laser light LL3 is, for example, less than or equal to 355 nm. In the present embodiment, for example, the wavelength of laser light LL3 is approximately 355 nm. In this case, the supporting substrate 5 transmits 70% or more of laser light having a wavelength less than or equal to 355 nm.

As described above, the lower surface or upper surface of the protective film PF is rough, and scatters transmitted laser light LL3. When the first insulating substrate 10 is irradiated with the scattered laser light LL3, asperities are formed on the lower surface of the first insulating substrate 10 in the second area AR2.

Figure 10:
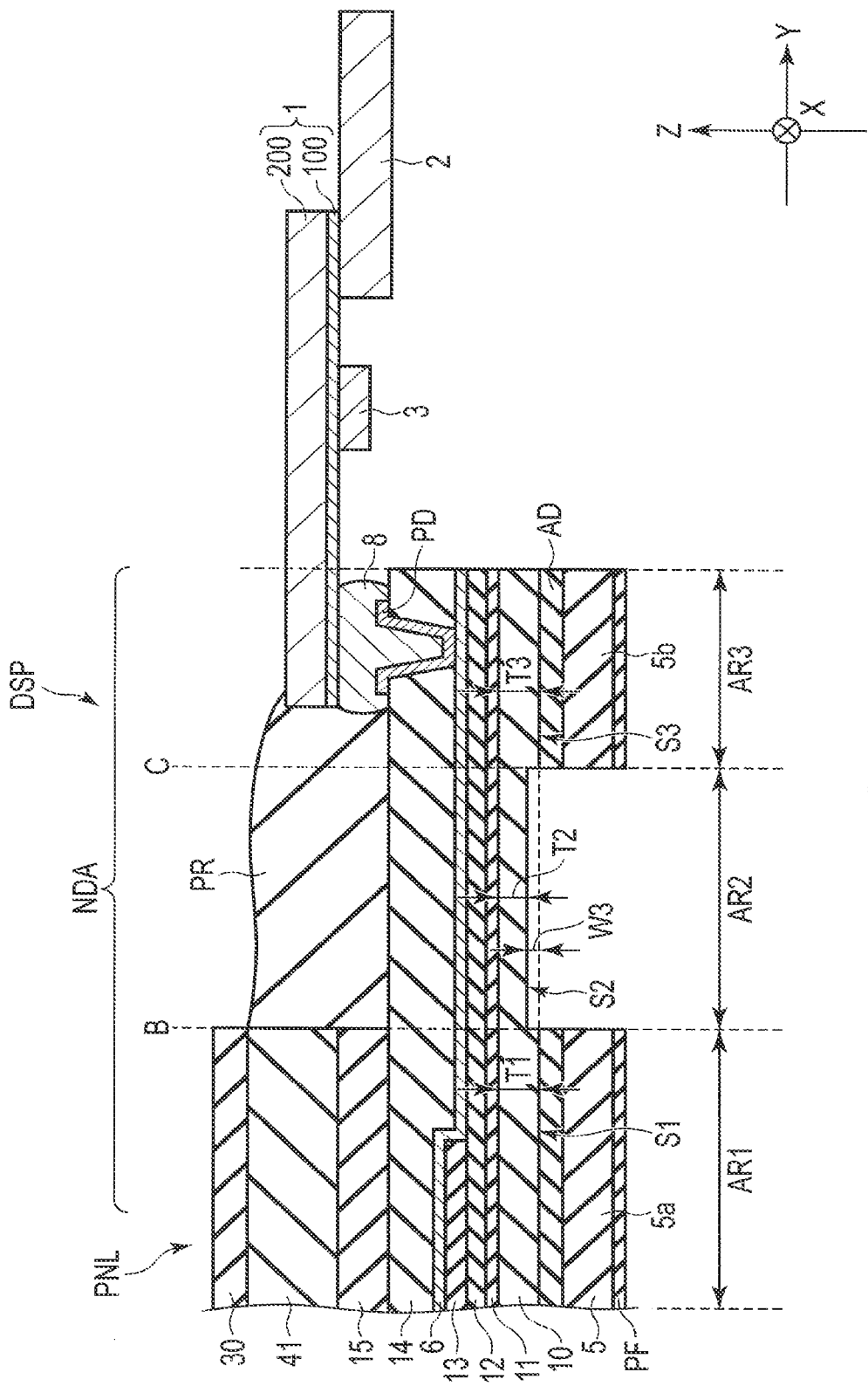
FIG. 10 is a cross-sectional view shown for explaining a state after the portion of the supporting substrate is removed in the second area.

FIG. 10 is a cross-sectional view shown for explaining a state after the portion 5c of the supporting substrate 5 is removed in the second area AR2.

In the step shown in FIG. 9, the first insulating substrate 10 is subjected to ablation by laser light LL3. Thus, film thickness T2 is less than film thickness T1 and film thickness T3. The second surface S2 is located on the upper side in comparison with the first surface S1 and the third surface S3. In the present embodiment, width W3 of the difference between the second surface S2 and the first and third surfaces S1 and S3 is, for example, approximately 150 Å (15 nm).

The second surface S2 can be formed so as to be rougher than the first surface S1 and the third surface S3 by irradiation with the laser light LL3 which has passed through the protective film PF and has been scattered. Since the second surface S2 is rough, it is difficult to attach the supporting substrate 5 removed in the second area AR2 to the second area AR2 again.

As the supporting substrate 5 is removed in the area overlapping the second area AR2, the first and second portions 5a and 5b of the supporting substrate 5 are formed. The first portion 5a is attached to the first surface S1 by the adhesive layer AD. The second portion 5b is attached to the third surface S3 by the adhesive layer AD. The second portion 5b overlaps the wiring substrate 1 in the third direction Z.

FIG. 11 is a cross-sectional view shown for explaining a step for bending the bend portion BA of the display panel PNL.

A base 9 is attached to the first portion 5a by an adhesive layer AD1 after the position is adjusted. Subsequently, the bend portion BA of the display panel PNL is bent such that the pad PD is located under the display panel PNL. Specifically, the bend portion BA is bent based on the base 9 such that the wiring substrate 1 is located under the base 9. In this way, the wiring substrate 1 is attached to the base 9 by an adhesive layer AD2. In the present embodiment, for example, the base 9 is formed like a sheet.

FIG. 12 is a cross-sectional view showing a state after the bend portion BA of the display panel PNL shown in FIG. 11 is bent.

The bend area BA is bent such that the first area AR1 of the display panel PNL faces the wiring substrate 1. In the present embodiment, the radius of curvature can be less than or equal to 1 mm. For example, the radius of curvature of the bend area BA is approximately 0.3 mm. The base 9 is provided between the first area AR1 and the wiring substrate 1. Since the base 9 is provided, stress is applied from the base 9 to the display panel PNL or the wiring substrate 1 even for external impact. Thus, the display panel PNL and the wiring substrate 1 are difficult to damage. The provision of the base 9 improves the adhesiveness between the first area AR1 and the wiring substrate 1.

The adhesive layer AD1 is provided between the first area AR1 and the base 9 such that they are attached to each other. The adhesive layer AD2 is provided between the wiring substrate 1 and the base 9 such that they are attached to each other. The adhesive layers AD1 and AD2 may be continuously formed as shown in FIG. 12, or may be separately formed. The adhesive layers AD1 and AD2 are, for example, double-faced tape.

In the present embodiment, the first and second portions 5a and 5b of the supporting substrate 5 are formed by removing the supporting substrate 5 in the area overlapping the second area AR2. Thus, the same member can be consistently used for the supporting substrate 5 from the step for attaching the supporting substrate 5 to the first insulating substrate 10 as shown in FIG. 6 to the step for bending the bend portion BA of the display panel PNL as shown in FIG. 11. There is no need to remove the supporting substrate attached to the entire part of the lower surface of the first insulating substrate 10 in the manufacturing process. It is possible to prevent damage of the display panel caused by electrostatic discharge (ESD) failure when the supporting substrate is removed. In other words, there is no need to perform a step for removing the supporting substrate 5 from the first insulating substrate 10 in which the first insulating substrate 10 is electrostatically charged. Thus, it is possible to prevent the ESD failure of insulating films such as the second and third insulating films 12 and 13. In this way, the destruction of the switching elements SW can be prevented. Moreover, it is possible to prevent increase in the manufacturing cost caused by using another supporting substrate.

As explained above, the present embodiment can achieve a display device capable of reducing the manufacturing cost or a display device capable of preventing reduction in manufacturing yield.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the above embodiments, the first and second portions 5a and 5b of the supporting substrate 5 are formed by removing the supporting substrate 5 in the area overlapping the second area AR2. However, the first and second portions 5a and 5b of the supporting substrate 5 may be separately attached to the first substrate SUB1.

The base 9 shown in FIG. 12 may be omitted. In this case, the bent part may be hollow, or may be filled with the adhesive agents AD1 and AD2, etc.

The above embodiments are not limited to an organic electroluminescence display device, and may be applied to a liquid crystal display device. In this case, the display panel PNL is, for example, a liquid crystal display panel comprising a liquid crystal layer held between the first substrate SUB1 and the second substrate SUB2. When the display panel PNL is a liquid crystal display panel, the liquid crystal display panel may be either a reflective type liquid crystal display panel which displays an image by selectively reflecting light made incident through the second substrate SUB2 side, or a transmissive type liquid crystal display panel which displays an image by selectively transmitting light made incident through the first substrate SUB1 side. When the display area DA overlaps the wiring substrate 1 as seen in plan view, a reflective type is preferably employed. However, when a backlight unit can be provided between the first substrate SUB1 and the wiring substrate 1, a transmissive type may be employed. Even when the display device DSP is a liquid crystal display device, its main structures are substantially the same as those of the embodiments.

What is claimed is:
1. A display device, comprising:
   an insulating substrate including:
      a first area having a display area,
      a second area adjacent to the first area, and
      a third area adjacent to the second area;
   a wiring substrate mounted on a surface side of the insulating substrate at a position that overlaps the third area; and
   a supporting substrate fixed to another surface side of the insulating substrate, the other surface side being opposite to the surface side, the supporting substrate including:

a first supporting substrate that overlaps the first area in a plan view, and a second supporting substrate that overlaps the third area in a plan view, wherein the third area includes a mounting portion for mourning the wiring substrate, the second area is located between the first area and the third area, and does not overlap the first supporting substrate and the second supporting substrate in a plan view, the insulating substrate is bent at the second area so that the first area and the third area face each other, the first supporting substrate and the second supporting substrate face each other, a second thickness of the insulating substrate in the second area is less than each of a first thickness of the insulating substrate in the first area and a third thickness of the insulating substrate in the third area, and a second surface of the insulating substrate on the other surface side in the second area is rougher than each of a first surface of the insulating substrate on the other surface side in the first area and a third surface of the insulating substrate on the other surface side in the third area.

2. The display device of claim 1, wherein the supporting substrate transmits 70% or more of laser light having a wavelength less than or equal to 355 nm.

3. The display device of claim 1, wherein the supporting substrate is polyethylene terephthalate.

4. The display device of claim 1, wherein the insulating substrate is bent in the second area such that the first area faces the wiring substrate.

\* \* \* \* \*